United States Patent
Shen et al.

(10) Patent No.: US 8,563,963 B2
(45) Date of Patent: Oct. 22, 2013

(54) LIGHT-EMITTING DIODE DIE PACKAGES AND METHODS FOR PRODUCING SAME

(75) Inventors: Yu-Nung Shen, Taipei (TW); Tsung-Chi Wang, Taipei (TW)

(73) Assignee: Evergrand Holdings Limited, Tortola (VG)

( * ) Notice: Subject to any disclaimer, the term of this patent is extended or adjusted under 35 U.S.C. 154(b) by 400 days.

(21) Appl. No.: 12/890,979

(22) Filed: Sep. 27, 2010

(65) Prior Publication Data

US 2011/0012138 A1 Jan. 20, 2011

Related U.S. Application Data

(63) Continuation-in-part of application No. 12/700,062, filed on Feb. 4, 2010, now Pat. No. 8,242,517.

(30) Foreign Application Priority Data

Feb. 6, 2009 (TW) ................................ 98104011 A

(51) Int. Cl.
H01L 31/00 (2006.01)
H01L 33/00 (2010.01)
H01L 21/00 (2006.01)

(52) U.S. Cl.
USPC ................................ 257/13; 257/79; 438/116

(58) Field of Classification Search
USPC ....................................... 257/13, 79; 438/116
See application file for complete search history.

(56) References Cited

U.S. PATENT DOCUMENTS

| | | | | |
|---|---|---|---|---|
| 5,959,316 A * | 9/1999 | Lowery | | 257/98 |
| 2007/0034995 A1 * | 2/2007 | Kameyama et al. | | 257/666 |
| 2008/0164482 A1 * | 7/2008 | Obara et al. | | 257/88 |
| 2009/0309116 A1 * | 12/2009 | Kato et al. | | 257/98 |
| 2010/0219430 A1 * | 9/2010 | Wu | | 257/91 |
| 2010/0320488 A1 * | 12/2010 | Horie | | 257/91 |
| 2011/0284909 A1 * | 11/2011 | Sugizaki | | 257/99 |

* cited by examiner

*Primary Examiner* — James Mitchell
(74) *Attorney, Agent, or Firm* — Jackson IPG PLLC

(57) ABSTRACT

The present invention relates to a light-emitting diode die package. The LED die package includes a semiconductor base, at least two electrodes disposed on an electrode mounting surface of the semiconductor base, an insulation layer formed on the electrode-mounting surface and provided with two through holes for exposing the electrodes, a conductor-forming layer formed on the insulation layer and provided with two conductor-mounting holes in communication with the through holes, and conductor units formed within the through holes and the conductor-mounting holes in a manner electrically connected to the corresponding electrodes. The LED die package further includes a covering layer formed on a surface of the LED die opposite to the electrode-mounting surface and extending to an outer surface of the LED die. The covering layer is made of transparent material doped with phosphor powder.

12 Claims, 9 Drawing Sheets

LIGHT-EMITTING DIODE DIE PACKAGES AND METHODS FOR PRODUCING SAME

CROSS-REFERENCE TO RELATED APPLICATION

This application is a continuation-in-part of U.S. Ser. No. 12/700,062 filed on Feb. 4, 2010, now U.S. Pat. No. 8,242,517 the disclosure of which is incorporated herein by reference in its entirety.

BACKGROUND OF THE INVENTION

1. Field of the Invention

The present invention relates to light-emitting diode (LED) die packages and methods for producing the same.

2. Description of the Prior Art

Starting with the mass production of white-light LEDs in 1996 by Nichia Corporation, LED manufacturers worldwide have focused their research and development efforts on white-light LEDs. So far, the white-light LED products available in the market normally have a structure based on those developed by Nichia Corporation. However, those conventional white-light LED products possess significant drawbacks as described in R.O.C. Patent Application No. 097146076 filed by the common applicants of this application.

The invention overcomes the conventional drawbacks by providing new white-light LED packages which differs from those developed by Nichia Corporation in terms of structural arrangement.

SUMMARY OF THE INVENTION

A light-emitting diode die package according to a technical feature of the invention is provided, which comprises a light-emitting diode (LED) die including a semiconductor base having an electrode-mounting surface, at least two electrodes disposed on the electrode mounting surface of the semiconductor base, an insulation layer formed on the electrode-mounting surface and provided with two through holes for exposing the corresponding electrodes, a conductor-forming layer formed on the insulation layer and provided with two conductor-mounting holes in communication with the corresponding through holes of the insulation layer, and conductor units formed within the through holes and the conductor-mounting holes in a manner electrically connected to the corresponding electrodes; and a covering layer formed on a surface of the LED die opposite to the electrode-mounting surface and extending to an outer surface of the LED die, the covering layer being made of a transparent material doped with phosphor powder.

According to another technical feature of the invention, a method for producing a light-emitting diode die package is provided, which comprises the steps of: providing a plurality of light-emitting diode (LED) dies, each including a semiconductor base having an electrode-mounting surface, at least two electrodes disposed on the electrode mounting surface of the semiconductor base, an insulation layer formed on the electrode-mounting surface and provided with two through holes for exposing the corresponding electrodes, a conductor-forming layer formed on the insulation layer and provided with two conductor-mounting holes in communication with the corresponding through holes of the insulation layer, and conductor units formed within the through holes and the conductor-mounting holes in a manner electrically connected to the corresponding electrodes; arranging the LED dies in an array on a supporting surface of a support; forming a transparent covering layer on the supporting surface of the support in a manner covering all of the LED dies, wherein the covering layer is doped with phosphor powder; and dicing the covering layer to obtain a plurality of LED die packages, each comprising at least one LED die.

BRIEF DESCRIPTION OF THE DRAWINGS

The above and other objects, features and effects of the invention will become apparent with reference to the following description of the preferred embodiments taken in conjunction with the accompanying drawings, in which.

DETAILED DESCRIPTION OF THE PREFERRED EMBODIMENTS

Figure 1:
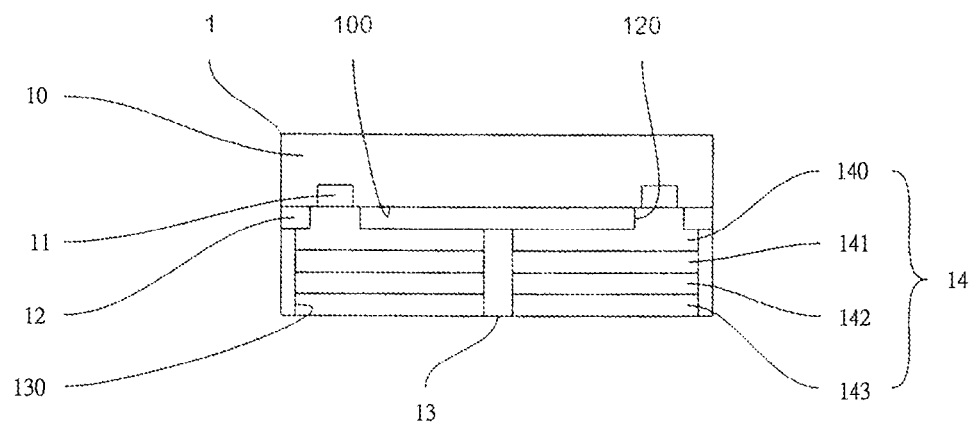
FIGS. 1-5 are schematic diagrams illustrating a method for producing an LED die package according to the first preferred embodiment of the invention.

Before the present invention is described in greater detail, it should be noted that the same or like elements are denoted by the same reference numerals throughout the disclosure. Moreover, the elements shown in the drawings are not illustrated in actual scale, but are expressly illustrated to explain in an intuitive manner the technical feature of the invention disclosed herein.

FIGS. 1-5 are schematic diagrams illustrating a method for producing an LED die package according to the first preferred embodiment of the invention.

Referring to FIGS. 1-5, a plurality of light-emitting diode (LED) dies 1 are prepared as shown in FIG. 1 (For illustrative purpose, FIG. 1 shows only a single LED die 1). Each of LED dies 1 has a semiconductor base 10, at least two electrodes 11 disposed on an electrode mounting surface 100 of the semiconductor base 10, an insulation layer 12 formed on the electrode-mounting surface 100 and provided with two through holes 120 for exposing the electrodes 11 corresponding thereto, a conductor-forming layer 13 formed on the insulation layer 12 and provided with two conductor-mounting holes 130 in communication with the corresponding through holes 120 of the insulation layer 12, and conductor units 14 formed within the through holes 120 and the conductor-mounting holes 130 in a manner electrically connected to the corresponding electrodes 11.

The conductor units 14 are each made of a single or multiple materials. As illustrated in this embodiment, the conductor units 14 can be made of four types of materials, which comprises a first conductor layer 140 made by anyone of copper, diamond-graphite, silicon carbide, aluminum, zinc, silver and like materials, a second conductor layer 141 made by anyone of copper, diamond-graphite, silicon carbide, aluminum, zinc, silver and like materials, a third conductor layer 142 made by nickel or a like material, and a fourth conductor layer 143 made by gold or a like material.

Figure 2:
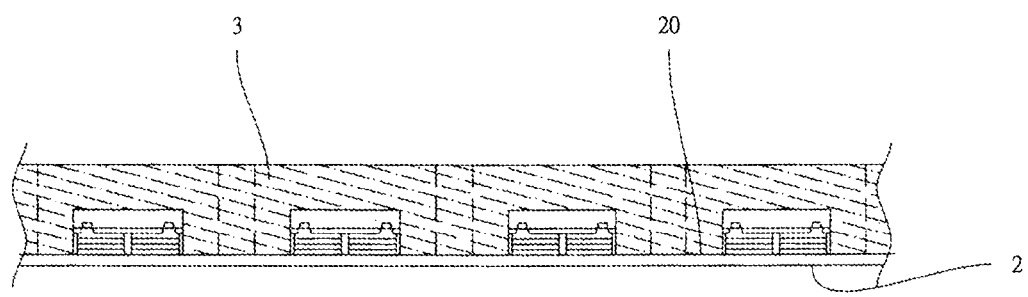
Figure 3:
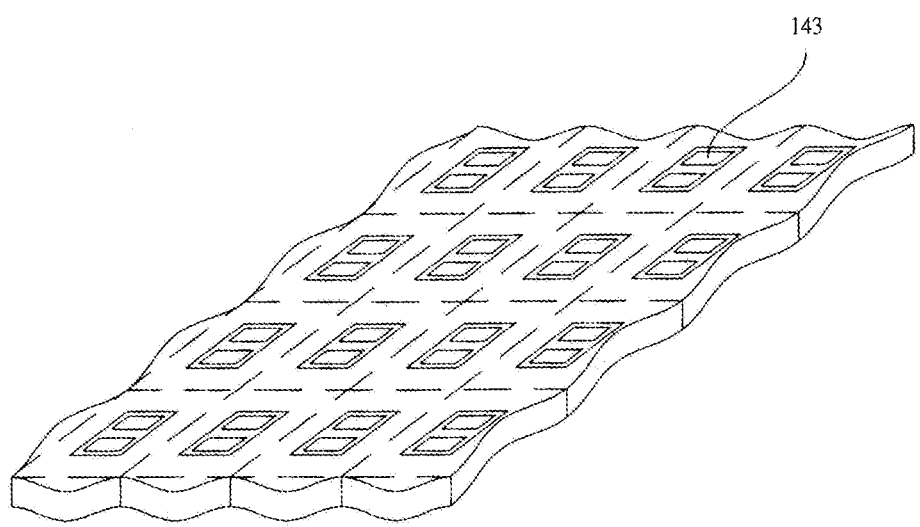

As shown in FIG. 2, the LED dies 1 are arranged in an array on a supporting surface 20 of a support 2. Next, a transparent covering layer 3 is formed on the supporting surface 20 of the support 2 in a manner covering all of the LED dies 1. It should be noted that the covering layer 3 is doped with phosphor powder, so that the LED dies 1, when activated, will emit light with a desired color. The support 2 is removed after the formation of the covering layer 3, so that the respective fourth conductor layers 143 of the conductor units 14 are exposed as shown in FIG. 3.

Referring together to FIGS. 17-22, the conductor units 14 can be configured in various shapes.

Figure 4:
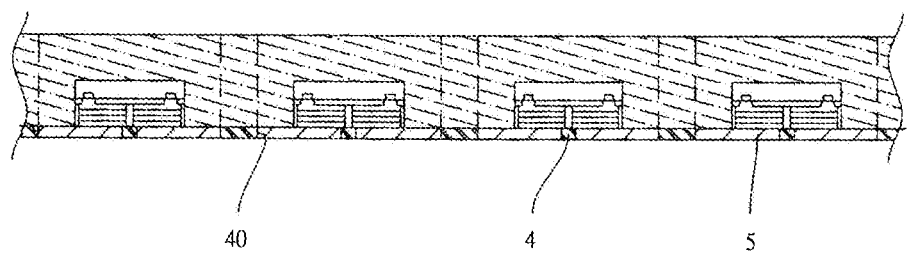

As shown in FIG. 4, the covering layer 3 has a surface flush with the conductor units 14, on which a protective layer 4 is formed to cover all of the conductor units 14. Then, the protective layer 4 is formed with a plurality of exposure holes 40 for exposing the corresponding conductor units 14. An electrically conductive material 5 is filled within the respective exposure holes 40, so as to establish electrical connection with the corresponding conductor units 14. Finally, the resulting structure is subjected to a dicing process to obtain an LED die package shown in FIG. 5.

Figure 5:
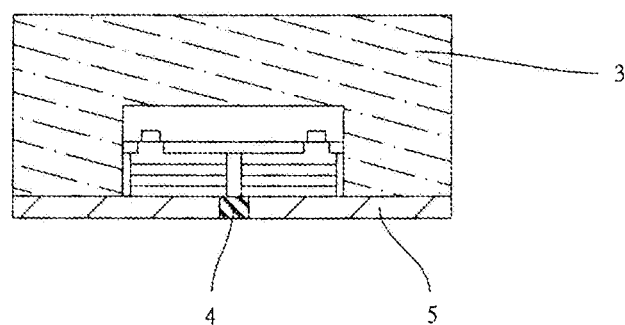

It should be noted that the electrically conductive material 5 disposed on the LED die package shown in FIG. 5 has a surface area much greater than that of the conductor unit 14. This technical feature will be quite helpful when the LED die package is going to be mounted onto another device (not shown).

In addition, the LED dies 1 are mounted onto the supporting surface 20 of a support 2 in accordance with the standard dimensions for LED SMD operation, such as the specification known as 0603/0402/0201/01005.

Figure 6:
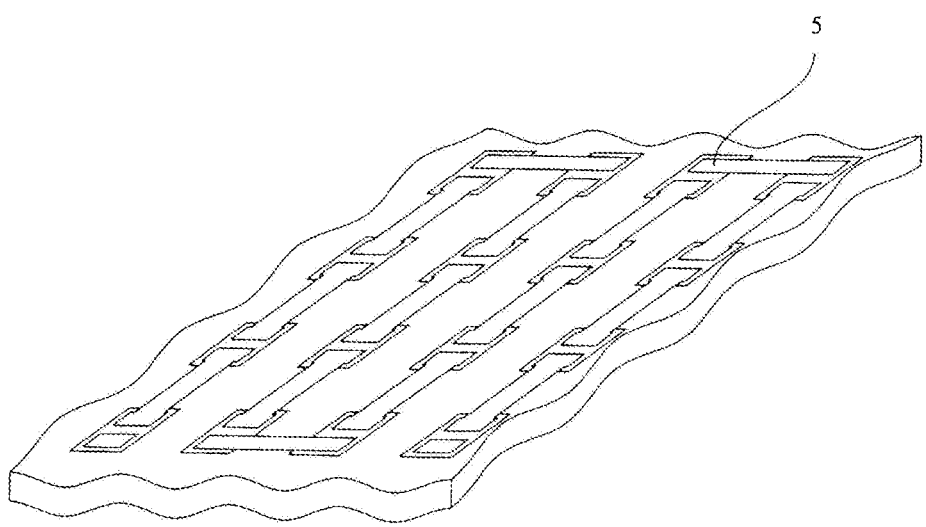
FIG. 6 is a schematic cross-section view illustrating an alternative method for producing an LED die package according to the first preferred embodiment of the invention.

FIG. 6 is a schematic cross-section view illustrating an alternative method for producing an LED die package according to the first preferred embodiment of the invention.

FIG. 6 depicts an alternative step to that shown in FIG. 4, in which the exposure holes 40 of the protective layer 4 are formed to expose the conductor units 14 that correspond to the electrodes having either the same or the opposite polarity and residing in at least two neighboring LED dies 1, so that the at least two neighboring LED dies 1 are electrically connected either in parallel or in series through the electrically conductive material 5. As a result, an LED module composed of at least two LED dies 1 is obtained after the dicing process, which has a voltage rating of either AC/DC 100-130V or AC/DC 200-240V.

Figure 7:
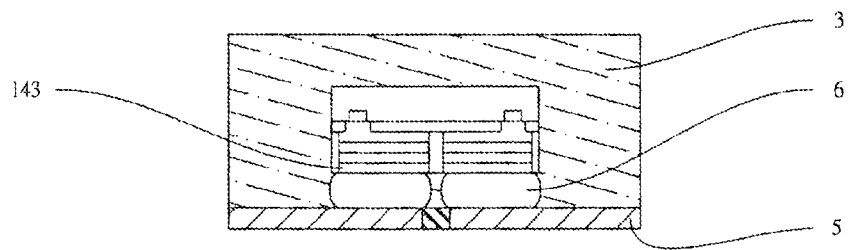
FIG. 7 is a schematic cross-section view of an LED die package according to the second preferred embodiment of the invention.

FIG. 7 is a schematic cross-section view of an LED die package according to the second preferred embodiment of the invention.

The embodiment shown in FIG. 7 differs from the first embodiment in that before the formation of the covering layer 3, the LED die 1 is further provided with a plurality of solder balls 6 disposed on the fourth conductor layer 143 of the corresponding conductor unit 14.

Figure 8:
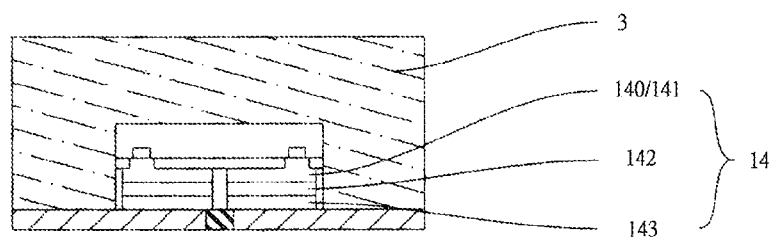
FIG. 8 is a schematic cross-section view of an alternative example of the LED die package according to the first embodiment of the invention.

FIG. 8 is a schematic cross-section view of an alternative example of the first embodiment of the invention, in which the respective conductor units 14 include only three conductor layers, with either the first conductor layer 140 or the second conductor layer 141 being omitted. It should be understood that the other conductor layers can be omitted instead.

Figure 9:
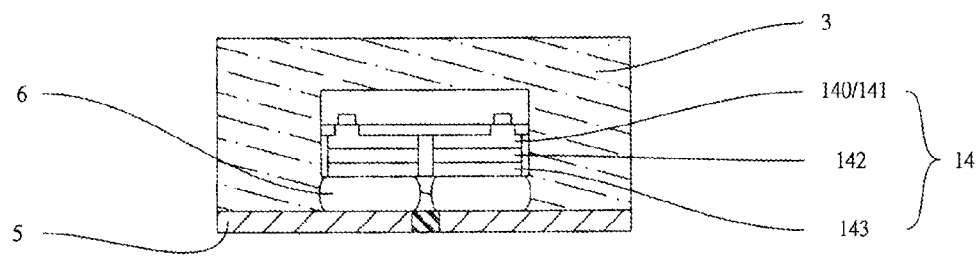
FIG. 9 is a schematic cross-section view of an alternative example of the LED die package according to the second embodiment of the invention.
Figure 10:
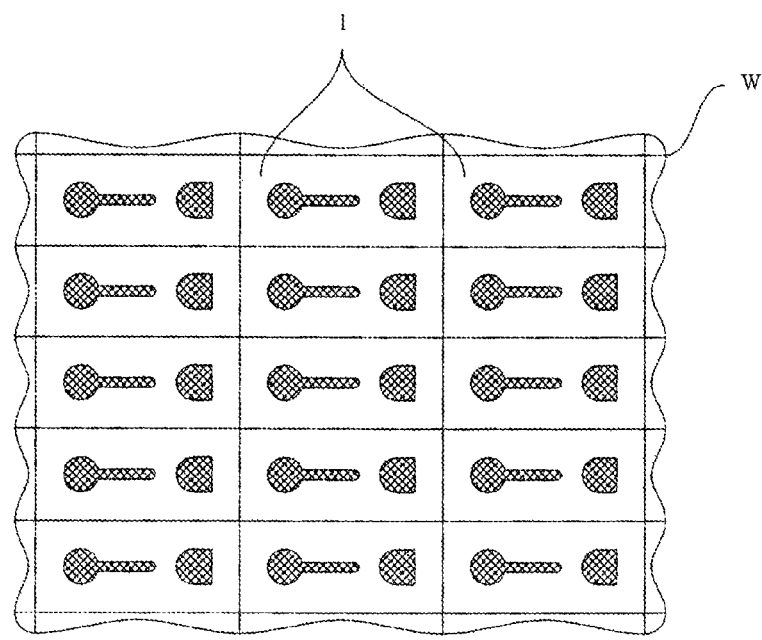
FIGS. 10-16 are schematic diagrams illustrating a method for producing an LED die package according to the third preferred embodiment of the invention.
Figure 11:
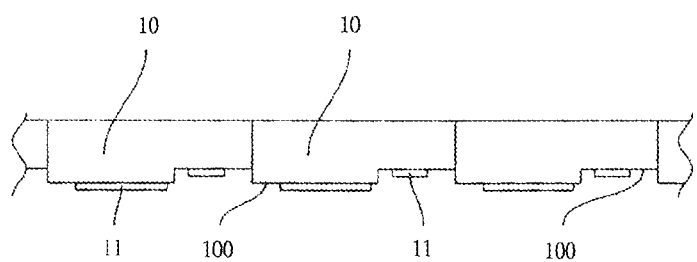

FIG. 9 is a schematic cross-section view of an alternative example of the second embodiment of the invention. Similar to the embodiment shown in FIG. 8, the respective conductor units 14 include only three conductor layers, with either the first conductor layer 140 or the second conductor layer 141 being omitted. It should be understood that the other conductor layers can be omitted instead.

FIGS. 10-16 are schematic diagrams illustrating a method for producing an LED die package according to the third preferred embodiment of the invention.

As shown in FIGS. 10-16, an LED wafer W is first provided (FIG. 9 illustrates only part of the LED wafer W). The LED wafer W includes a plurality of LED dies 1, each including a semiconductor base 10 and at least two electrodes 11 disposed on an electrode-mounting surface 100 of the semiconductor base 10.

Figure 12:
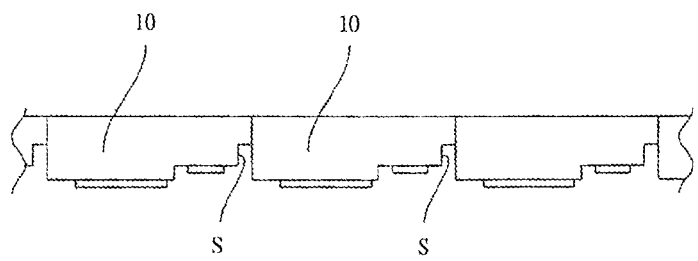
Figure 13:
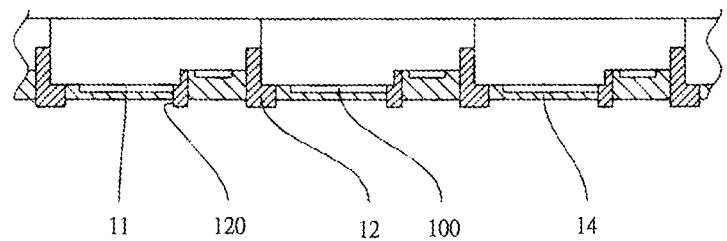
Figure 14:
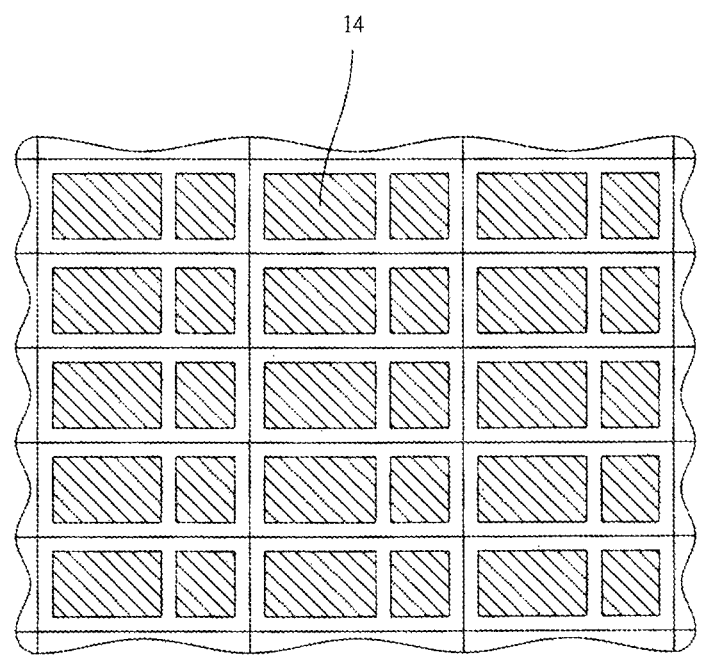

Next, the LED wafer W is diced such that a gap S is generated between every two neighboring LED dies 1 as illustrated in FIG. 12, whereby a continuous metal layer (not shown) present among the neighboring LED dies 1 is divided.

Afterwards, an insulation layer 12 is formed on the electrode-mounting surface 100 of the LED die 1 and provided with a plurality of through holes 120 for exposing the electrodes 11 corresponding thereto. According to this embodiment, the insulation layer 12 is transparent to light and doped with phosphor powder.

Subsequent to the formation of the insulation layer 12, the respective through holes 120 are each formed inside with a conductor unit 14 electrically conducted to a corresponding one of the electrodes 11. It should be noted that the respective conductor units 14 have a surface area much greater than that of the corresponding electrode 11, whereby the LED die 1 is suited to be mounted on the other electronic parts.

Figure 15:
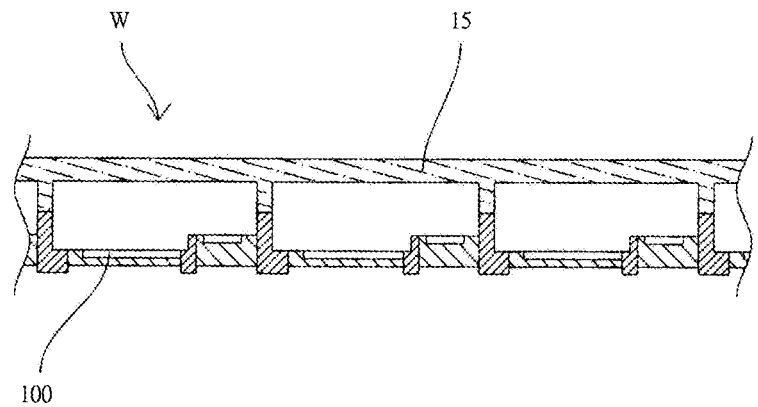
Figure 16:
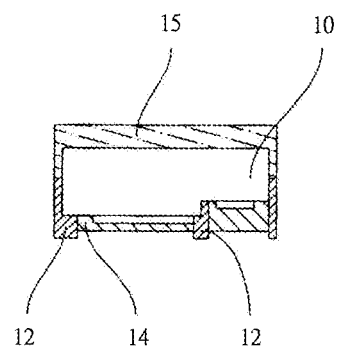
Figure 17:
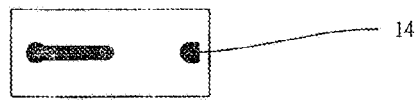
FIGS. 17-22 are schematic diagrams showing various examples of the conductor units used in the invention.
Figure 18:
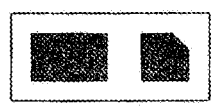
Figure 19:
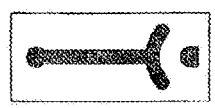
Figure 20:
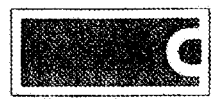
Figure 21:
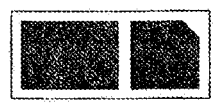
Figure 22:

As shown in FIG. 15, the surface of the LED wafer W opposite to the electrode-mounting surface 100 is subsequently subjected to a dicing process and further coated with a phosphor powder layer 15, so that the phosphor powder layer 15 is connected to the insulation layer 12 formed within the gap S. Finally, the resulting structure is subjected to a dicing process to obtain an LED die package shown in FIG. 16.

It should be noted that the conductor unit 14 disclosed in this embodiment can be configured to have the same structures as those described in the embodiments above.

In conclusion, the LED die packages and the methods for producing the same as disclosed herein can surely achieve the intended objects and effects of the invention by virtue of the structural arrangements and operating steps described above.

While the invention has been described with reference to the preferred embodiments above, it should be recognized that the preferred embodiments are given for the purpose of illustration only and are not intended to limit the scope of the present invention and that various modifications and changes, which will be apparent to those skilled in the relevant art, may be made without departing from the spirit of the invention and the scope thereof as defined in the appended claims.

What is claimed is:

1. A light-emitting diode die package, comprising:
a light-emitting diode (LED) die including a semiconductor base having an electrode-mounting surface, at least two electrodes disposed on the electrode mounting surface of the semiconductor base, an insulation layer formed on the electrode-mounting surface and provided with two through holes for exposing the corresponding electrodes, a conductor-forming layer formed on the insulation layer and provided with two conductor-mounting holes in communication with the corresponding through holes of the insulation layer, and conductor units formed within the through holes and the conductor-mounting holes in a manner electrically connected to the corresponding electrodes; and a covering layer formed on a surface of the LED die opposite to the electrode-mounting surface and extending to an outer surface of the LED die without contacting the electrodes, the covering layer being made of a transparent material doped with phosphor powder; wherein at least two bodies made of an electrically conductive material and extending from the corresponding conductor units to the covering layer that defines the outer surface of the LED die, the respective electrically conductive bodies having a surface area substantially greater than that of the corresponding one of the conductor units.

2. The light-emitting diode die package according to claim 1, further comprising at least one additional LED die connected in series or in parallel to the LED die through the electrically conductive bodies.

3. The light-emitting diode die package according to claim 1, further comprising a solder ball disposed between one of the conductor units and a corresponding one of the electrically conductive bodies.

4. The light-emitting diode die package according to claim 1, wherein the conductor units are made of at least two materials.

5. The light-emitting diode die package according to claim 4, wherein the respective conductor units comprise at least one conductor layer made by anyone of copper, diamond-graphite, silicon carbide, aluminum, zinc, silver and like materials, a conductor layer made by nickel or a like material, and a conductor layer made by gold or a like material.

6. A method for producing a light-emitting diode die package, comprising the steps of:
providing a plurality of light-emitting diode (LED) dies, each including a semiconductor base having an electrode-mounting surface, at least two electrodes disposed on the electrode mounting surface of the semiconductor base, an insulation layer formed on the electrode-mounting surface and provided with two through holes for exposing the corresponding electrodes, a conductor-forming layer formed on the insulation layer and provided with two conductor-mounting holes in communication with the corresponding through holes of the insulation layer, and conductor units formed within the through holes and the conductor-mounting holes in a manner electrically connected to the corresponding electrodes;
arranging the LED dies in an array on a supporting surface of a support;
forming a transparent covering layer on the supporting surface of the support in a manner covering all of the LED dies,
wherein the covering layer is doped with phosphor powder; and
dicing the covering layer to obtain a plurality of LED die packages, each comprising at least one LED die; wherein before the step of dicing the covering layer, a step of forming a protective layer on a surface of the covering layer which is flush with the conductor units, so as to cover all of the conductor units, wherein the protective layer is formed with a plurality of exposure holes that expose the corresponding conductor units and have a greater dimension than that of the corresponding conductor units; and a step of filling an electrically conductive material in the exposure holes.

7. The method for producing a light-emitting diode die package according to claim 6,
wherein in the step of forming the protective layer, the exposure holes of the protective layer are formed to expose the conductor units that correspond to the electrodes having either the same or the opposite polarity and residing in at least two neighboring LED dies, so that the at least two neighboring LED dies are electrically connected either in parallel or in series through the electrically conductive material, whereby an LED module composed of at least two LED dies is obtained after the dicing step, which has a voltage rating of either AC/DC 100-130V or AC/DC 200-240V.

8. The method for producing a light-emitting diode die package according to claim 6,
wherein in the step of providing the LED dies, each of the LED dies is further provided with two solder balls disposed on the corresponding conductor units.

9. The method for producing a light-emitting diode die package according to claim 6,
wherein in the step of forming the conductor units, the respective conductor units are made of at least two materials.

10. The method for producing a light-emitting diode die package according to claim 9,
wherein in the step of forming the conductor units, the respective conductor units comprise at least one conductor layer made by anyone of copper, diamond-graphite, silicon carbide, aluminum, zinc, silver and like materials, a conductor layer made by nickel or a like material, and a conductor layer made by gold or a like material.

11. A method for producing a light-emitting diode die package, comprising the steps of:
providing a light-emitting diode (LED) wafer including a plurality of LED dies, each including a semiconductor base having an electrode-mounting surface and at least two electrodes disposed on the electrode-mounting surface of the semiconductor base;
dicing the LED wafer, such that a gap is generated between every two neighboring LED dies, whereby a continuous metal layer present among the neighboring LED dies is divided;
forming an insulation layer on the electrode-mounting surface of the LED die, the insulation layer being transparent to light and doped with phosphor powder and formed with a plurality of through holes that expose the corresponding electrodes and have a greater dimension than that of the corresponding electrodes;
forming a conductor unit inside of the respective through holes, so that the respective conductor units are electrically conducted to the corresponding electrodes;
subjecting a surface of the LED wafer opposite to the electrode-mounting surface to dicing, and further coating the surface with a phosphor powder layer, so that the phosphor powder layer is connected to the insulation layer formed within the gap; and
dicing the insulation layer and the coating to obtain a plurality of LED die packages, each comprising at least one LED die.

12. The method for producing a light-emitting diode die package according to claim 11, wherein in the step of forming the insulation layer, the exposure holes of the insulation layer are formed to expose the conductor units that correspond to the electrodes having either the same or the opposite polarity and residing in at least two neighboring LED dies, so that the at least two neighboring LED dies are electrically connected either in parallel or in series through the electrically conductive material, whereby an LED module composed of at least two LED dies is obtained after the dicing step, which has a voltage rating of either AC/DC 100-130V or AC/DC 200-240V.

* * * * *